(12) United States Patent
Randolph et al.

(10) Patent No.: US 6,275,414 B1
(45) Date of Patent: Aug. 14, 2001

(54) UNIFORM BITLINE STRAPPING OF A NON-VOLATILE MEMORY CELL

(75) Inventors: Mark W. Randolph; Shane Charles Hollmer, both of San Jose; Pau-Ling Chen, Saratoga; Richard M. Fastow, Cupertino, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/721,035

(22) Filed: Nov. 22, 2000

Related U.S. Application Data
(60) Provisional application No. 60/204,621, filed on May 16, 2000.

(51) Int. Cl.$^7$ .................................................. G11C 16/04
(52) U.S. Cl. ........................................ 365/185.05; 365/63
(58) Field of Search .......................... 365/63, 51, 185.05, 365/185.13

(56) References Cited

U.S. PATENT DOCUMENTS 4,698,900 * 10/1987 Esquivel ................................. 437/82
6,044,015 * 3/2000 Van Houdt et al. ............ 365/185.15

* cited by examiner

Primary Examiner—Vu A. Le
(74) Attorney, Agent, or Firm—Wagner, Murabito & Hao LLP

(57) ABSTRACT

An array of memory cells that includes a plurality of memory cells interconnected via a grid of M wordlines and M bitlines, wherein M=2, 3, 4, 5, . . . and each of the M bitlines is buried. The array further includes a plurality of contacts, wherein each of the plurality of contacts is formed every N wordlines, N=1, 2, 3, . . . , wherein each of the plurality of contacts overlies a gate of a different one of the plurality of memory cells. A strap connects one of the buried bitlines to a gate that underlies one of the plurality of contacts and a select transistor is formed every P wordlines, wherein P is greater than N.

17 Claims, 6 Drawing Sheets

UNIFORM BITLINE STRAPPING OF A NON-VOLATILE MEMORY CELL

Applicants claim, under 35 U.S.C. §119(e), the benefit of priority of the filing date of May 16, 2000, of U.S. Provisional Patent Application Serial No. 60/204,621, filed on the aforementioned date, the entire contents of which are incorporated herein by reference.

BACKGROUND OF THE INVENTION

1. Field of the Invention

The present invention relates to the field of non-volatile memory devices. More particularly, the invention relates to a multi-bit flash electrically erasable programmable read only memory (EEPROM) cell with a bitline.

2. Discussion of Related Art

Memory devices for non-volatile storage of information are currently in widespread use today, being used in a myriad of applications. A few examples of non-volatile semiconductor memory include read only memory (ROM), programmable read only memory (PROM), erasable programmable read only memory (EPROM), electrically erasable programmable read only memory (EEPROM) and flash EEPROM.

Semiconductor EEPROM devices involve more complex processing and testing procedures than ROM, but have the advantage of electrical programming and erasing. Using EEPROM devices in circuitry permits in-circuit erasing and reprogramming of the device, a feat not possible with conventional EPROM memory. Flash EEPROMs are similar to EEPROMs in that memory cells can be programmed (i.e., written) and erased electrically but with the additional ability of erasing all memory cells at once, hence the term flash EEPROM.

An example of a single transistor Oxide-Nitrogen-Oxide (ONO) EEPROM device is disclosed in the technical article entitled "A True Single-Transistor Oxide-Nitride-Oxide EEPROM Device," T. Y. Chan, K. K. Young and Chenming Hu, IEEE Electron Device Letters, March 1987. The memory cell is programmed by hot electron injection and the injected charges are stored in the oxide-nitride-oxide (ONO) layer of the device. Other examples of ONO EEPROM devices are disclosed in U.S. Pat. Nos. 5,635,415; 5,768,192 and PCT patent application publication WO 99/07000, the contents of each reference are hereby incorporated herein by reference.

In the case of known NROM devices, such as schematically shown in FIG. 1, an NROM cell 100 included a grid of polygates or word lines 102 and buried bitlines 104. The bitlines 104 were formed in the N+ region of the substrate so that a higher density of bitlines can be formed that region versus when the bitlines were formed in a metal layer. Select transistors 106 were required to be placed every N or N/2 polygates 102, where N is the number of polygates between contacts 108. This in the past has required a select transistor 106 being required every 16 or 32 cells in order to reduce the bitline to cell resistance. The bitline resistance in the N+ region limits the number of cells between select transistors.

In the case of flash memory cells with a stacked gate, contacts associated with the cell must be spaced from the polysilicon of the gate. As feature sizes are reduced according to integrated circuit processes, smaller dimensions are required to achieve higher packing densities. Generally, contacts must be spaced apart from the stacked gate so alignment errors do not result in a shorting of the stacked gate with the source contact or the drain contact. The spacing between the contact and gate contributes to the overall size of the flash memory cell.

SUMMARY OF THE INVENTION

One aspect of the invention regards an array of memory cells that includes a plurality of memory cells interconnected via a grid of M wordlines and M bitlines, wherein M=2, 3, 4, 5, . . . and each of the M bitlines is buried. The array further includes a plurality of contacts, wherein each of the plurality of contacts is formed every N wordlines, N =1, 2, 3, . . ., wherein each of the plurality of contacts overlies a gate of a different one of the plurality of memory cells. A strap connects one of the buried bitlines to a gate that underlies one of the plurality of contacts and a select transistor is formed every P wordlines, wherein P is greater than N.

The above aspect of the present invention provides the advantage of decreasing the total cell resistance and increasing the number of cells between select transistors.

The above aspect of the present invention provides the advantage of reducing the total size of an array.

The present invention, together with attendant objects and advantages, will be best understood with reference to the detailed description below in connection with the attached drawings.

DETAILED DESCRIPTION OF THE INVENTION

Non-volatile memory designers have taken advantage of the ability of silicon nitride to store charge in localized regions and have designed memory circuits that utilize two regions of stored charge within the ONO layer. This type of non-volatile memory device is known as a two-bit EEPROM. The two-bit EEPROM is capable of storing twice as much information as a conventional EEPROM in a memory array of equal size. A left and right bit is stored in physically different areas of the silicon nitride layer, near left and right regions of each memory cell. Programming methods are then used that enable two-bits to be programmed and read simultaneously. The two-bits of the memory cell can be individually erased by applying suitable erase voltages to the gate and to either the source or drain regions.

Two bit memory cells are typically accessed by buried bit-lines formed in a semiconductor substrate. A bit-line oxide layer is formed over the buried bit-line prior to forming a central gate electrode.

Figure 2:
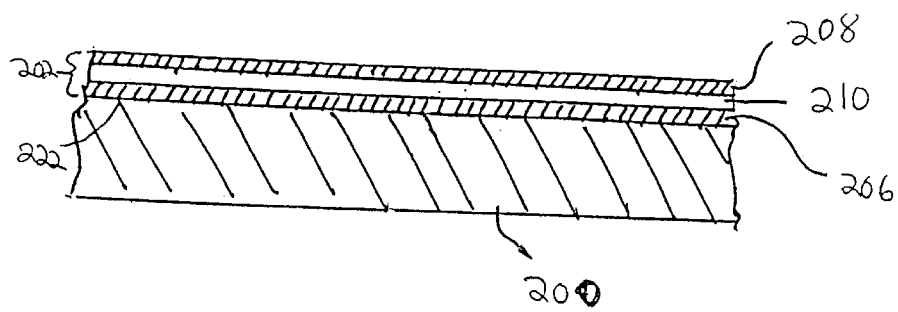
FIGS. 2–6 illustrate side cross-sectional views of processing steps to form an embodiment of the present invention.

Shown in FIG. 2, in cross-section is a portion of a semiconductor substrate 200 having already undergone several processing steps. An ONO layer 202 overlies the semiconductor substrate 200 and includes a first oxide layer 206, a second oxide layer 208 and a silicon nitride layer 210 sandwiched between the first oxide layer 206 and the second oxide layer 208.

Figure 3:
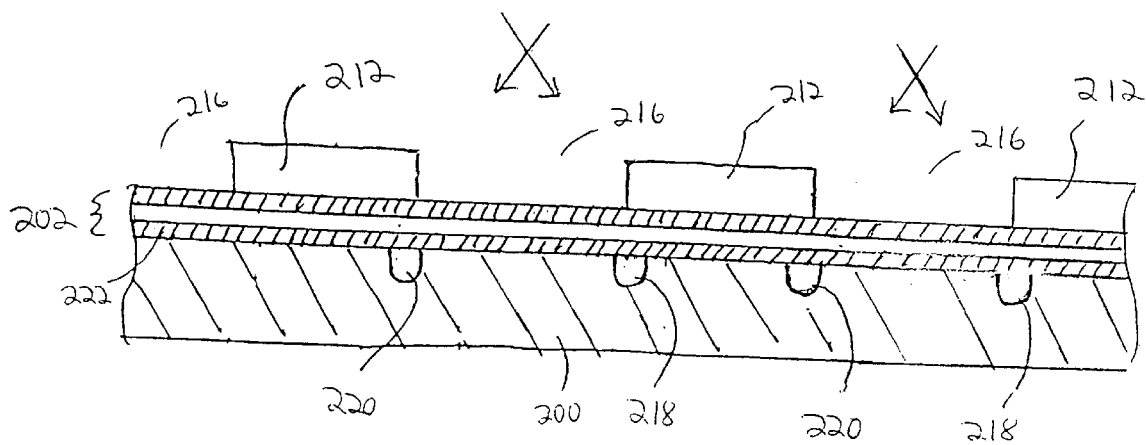

As shown in FIG. 3, a resist layer 212 is formed to overly the ONO layer 202. Resist layer 212 can be one of a number of different types of resist, including optical photoresist responsive to visible and near UV light, deep UV resist and the like. Alternatively, resist layer 212 can be an inorganic resist layer, an X-ray resist layer and the like. In a preferred embodiment, resist layer 212 is a Novolak resin photoresist material.

Resist layer 212 is exposed to radiation of the appropriate wavelength and developed to form a resist pattern overlying ONO layer 202, as illustrated in FIG. 3. Resist pattern 212 is formed to have a predetermined geometric configuration for the fabrication of buried bit-line regions in semiconductor substrate 200. Resist pattern 212 allows for exposing selected regions 216 of semiconductor substrate 200. Once resist pattern 212 is formed, an implantation process is carried out to form pocket regions 218, 220 in semiconductor substrate 200. Pocket regions 218, 220 are preferably formed by an angled ion implant process in which semiconductor substrate 200 is held at an angle of about 7° to about 60°, typically 30° to 45°, with respect to normal during the ion implantation process. The angled ion implant process forms pocket regions 218, 220 in semiconductor substrate 200 in locations that partially underlie a portion of resist pattern 212. In a preferred embodiment, a p-type dopant, such as boron, is ion implanted into semiconductor substrate 200 to form pocket regions 218, 220. During the ion implantation process, the boron ions penetrate ONO layer 202 and enter semiconductor substrate 200 at an angle sufficient to create a boron pocket region that extends partially beneath resist pattern 212.

Figure 4:
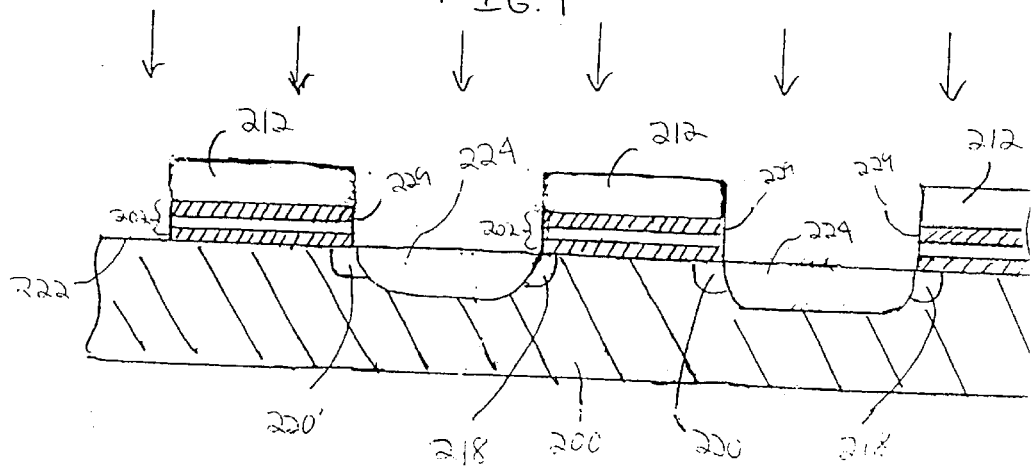

Referring to FIG. 4, after forming the pocket regions 218, 220, portions of ONO layer 202 exposed by resist pattern 212 are etched to expose principal surface 222 of semiconductor substrate 200. Preferably, resist pattern 212 is used as an etching mask, such that the etching process exposes principal surface 212 in selected regions 216 defined by resist mask 212. In a preferred embodiment, ONO layer 202 is anisotropically etched, such that ONO layer 202 and resist pattern 212 have continuous, substantially vertical sidewalls.

Once the etching process is complete, preferably an ion implantation process is carried out to form a buried bit-line region 224 in selected region 216 of semiconductor substrate 200. Preferably, an n-type dopant, such as arsenic, is ion implanted at an angle of incidence substantially normal to principal surface 222 of semiconductor substrate 200. Preferably, buried bit-line region 224 is formed by the ion implantation of arsenic using a dose of about $3 \times 10^{15}$ to about $5 \times 10^{15}$ ions per square centimeter. The ion implantation energy is selected so as to form buried bit-line region 224 to a selected junction depth in semiconductor substrate 200. Preferably, the ion implantation energy is of sufficient magnitude, such that the junction depth of buried bit-line region 224 is greater than the junction depth of pocket regions 218, 220. As used herein, the term "junction depth" refers to the distance from the surface of the substrate to the deepest point of formation of a p/n junction associated with the implanted region within the substrate.

Those skilled in the art will recognize that other methods for forming the memory cell arrays are possible. For example, the order of formation of the pocket regions 218, 220 and the buried bit-line region 224 can be reversed from that described above. In an alternative embodiment, before etching ONO layer 202, an implant process can be carried out to form bit-line region 224, followed by an angled implant process to form pocket regions 218, 220. In yet another alternative, ONO layer 202 can be etched before either implant process is carried out.

Figure 5:
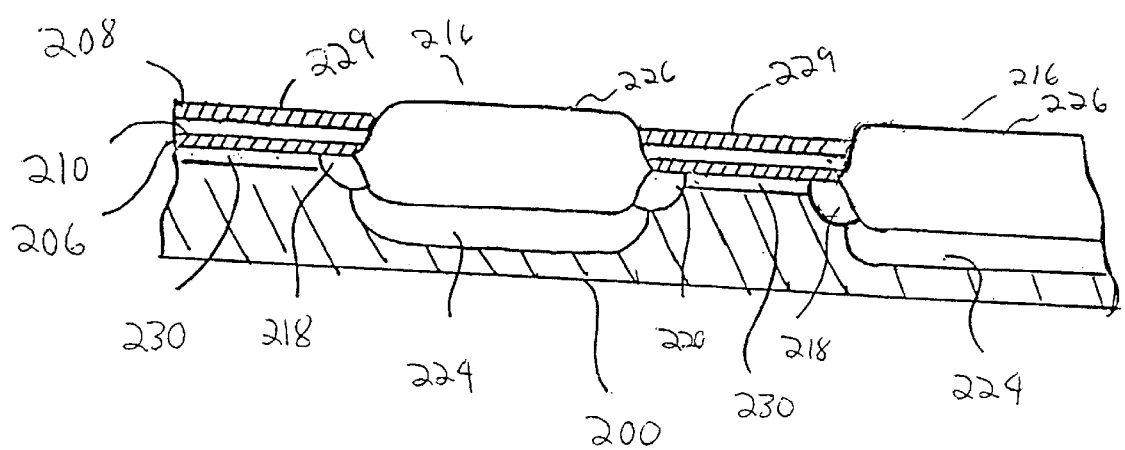

As illustrated in FIG. 5, the resist pattern 212 is removed and bit-line oxide regions 226 are formed. In a preferred embodiment, bit-line oxide layer 226 is formed by thermal oxidation of semiconductor substrate 200 using ONO layer 202 as an oxidation mask. ONO layer 202, having been previously patterned by the etching process described above, exposes selected regions 216 of semiconductor substrate 200. During the oxidation process, the patterned portions of ONO layer 202 prevent the oxidation of semiconductor substrate 200 in region underlying ONO layer 202. Accordingly, bit-line oxide layers 226 are confined to selected regions 216 of semiconductor substrate 200. Upon completion of the oxidation process, bit-line layers 226 overly buried bit-line regions 224 in semiconductor substrate 200.

Figure 6:
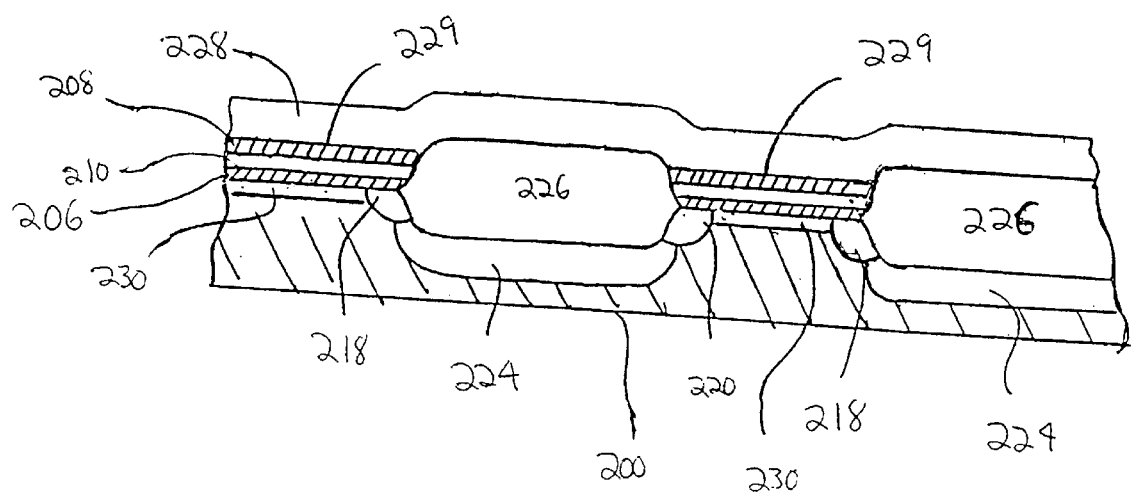

In addition to the layers 226, control gate electrode contacts/electrodes 228 are formed over the floating gate electrodes 229 by depositing a layer of polycrystalline silicon by a CVD process, followed by patterning and etching to form thin control-gate lines overlying the substrate 200. As shown in FIG. 6, the electrode 228 overlies the layers 226 and bit line oxide regions 224.

Once the above-described process is complete, a two bit flash EEPROM cell is formed as shown in FIG. 6. The flash EEPROM memory cell includes an N+ type substrate 200 having two buried PN junctions, one being between the source pocket 218 and substrate 200, termed the left junction and the other being between the drain pocket 220 and the substrate 200, termed the right junction. Above the channel 230 is an oxide layer 206 made of silicon dioxide. The oxide layer 206 has a thickness that is less than or equal to 60 Angstroms, and which forms an electrical isolation layer over the channel.

On top of the oxide layer 206 is a charge trapping layer 210 that has a thickness ranging from approximately 20 to 100 Angstroms and preferably is comprised of silicon nitride, $Si_3N_4$. The hot electrons are trapped as they are injected into the charge trapping layer so that the charge trapping layer serves as the memory retention layer.

The thickness of layer 210 is chosen to be in excess of approximately 50 Angstroms to prevent electrons from tunneling through the layer 206 and leaving charge trapping layer 210 during the operation of the cell. Thus, the lifetime of the cell of this invention is greatly extended relative to prior art NMOS devices. The memory cell is capable of storing two bits of data, a right bit and a left bit.

It is important to note that the two-bit memory cell is a symmetrical device. For example, the left junction serves as the source terminal and the right junction serves as the drain terminal for the right bit. Similarly, for the left bit, the right junction serves as the source terminal and the left junction serves as the drain terminal. Thus, the terms left, or first junction and right or second junction are used herein rather than source and drain. When the distinction between left and right bits is not crucial to the particular discussion, the terms source and drain are utilized. However, it should be understood that the source and drain terminals for the second bit are reversed compared to the source and drain terminals for the first bit.

A layer of silicon dioxide 208 is formed over the charge trapping layer, (i.e., silicon nitride layer), and has a thickness that ranges between approximately 60 to 100 Angstroms. The silicon dioxide layer 208 functions to electrically isolate a conductive gate 228 formed over the silicon dioxide layer 208 from charge trapping layer 210. The thickness of gate 228 is approximately 4,000 Angstroms. Gate 228 is constructed from an N-type material, such as polycrystalline silicon that is typically heavily doped with an N-type impurity such as phosphorous in the $10^{19}$ to $10^{20}$ atom/cc range.

Figure 1:
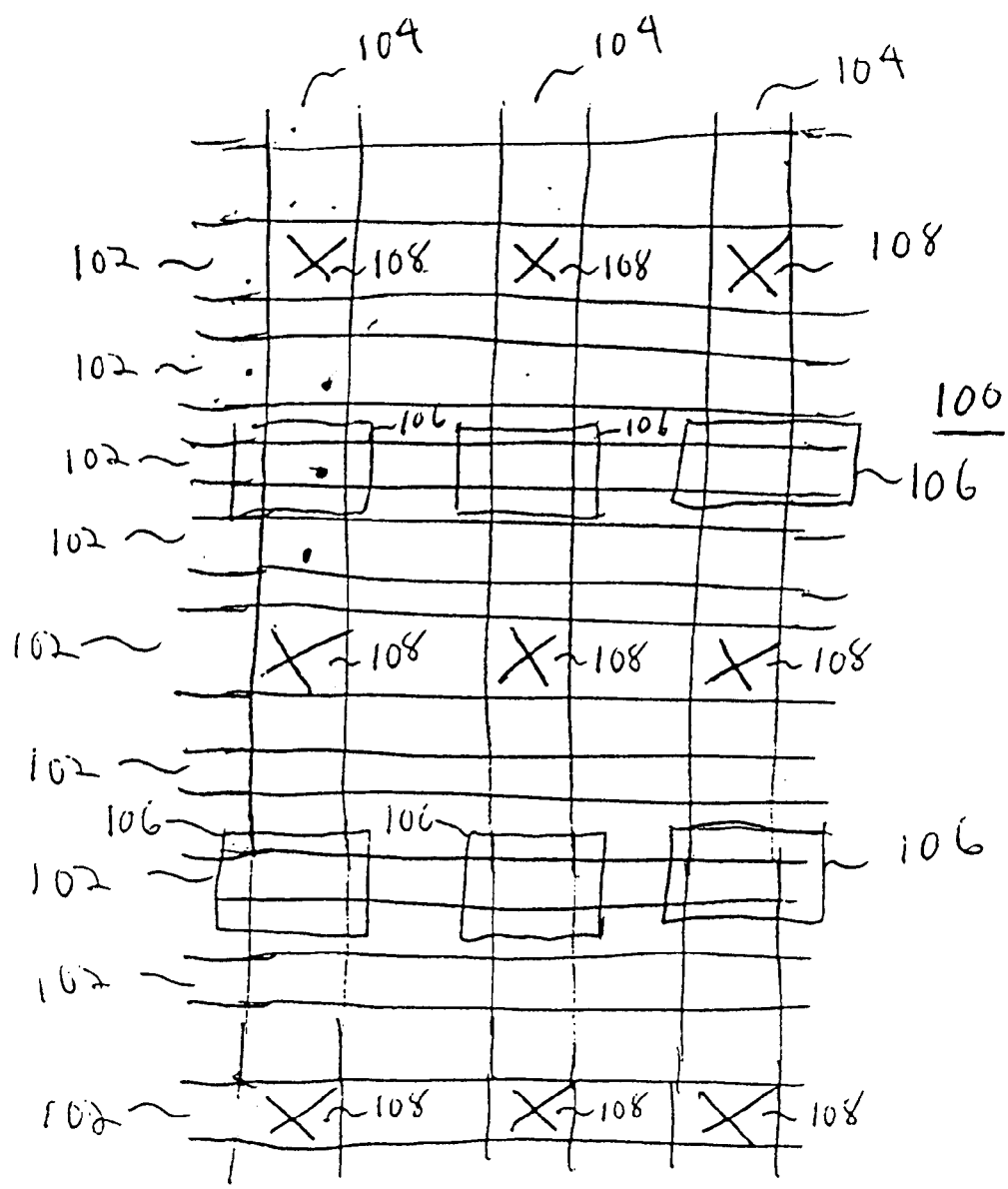
FIG. 1 illustrates a top cross-sectional view of a prior art NROM cell with a buried bit line.
Figure 7:
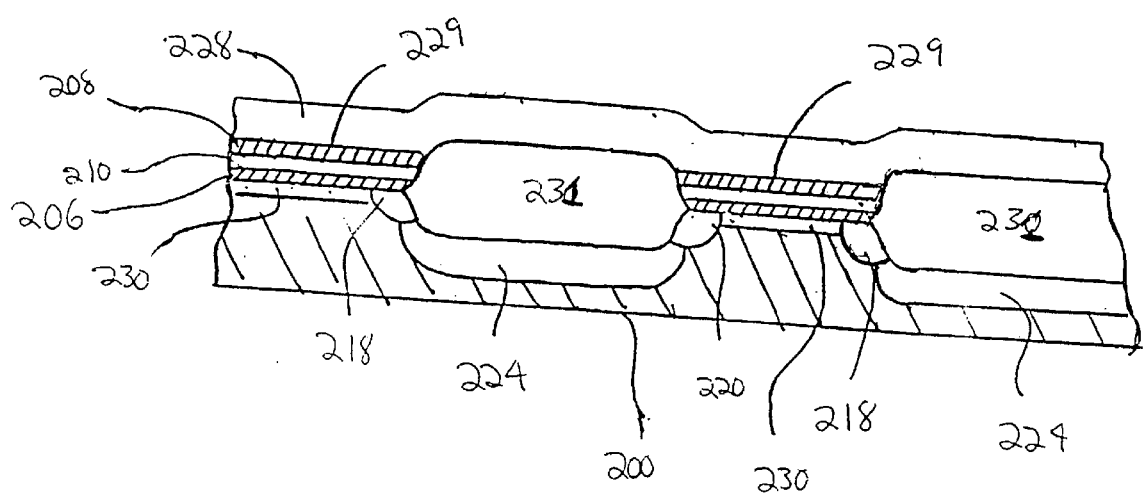
FIG. 7 illustrates a side cross-sectional view of a two-bit flash EEPROM cell constructed in accordance with an embodiment of the present invention utilizing the prowess of FIGS. 2–6.
Figure 8:
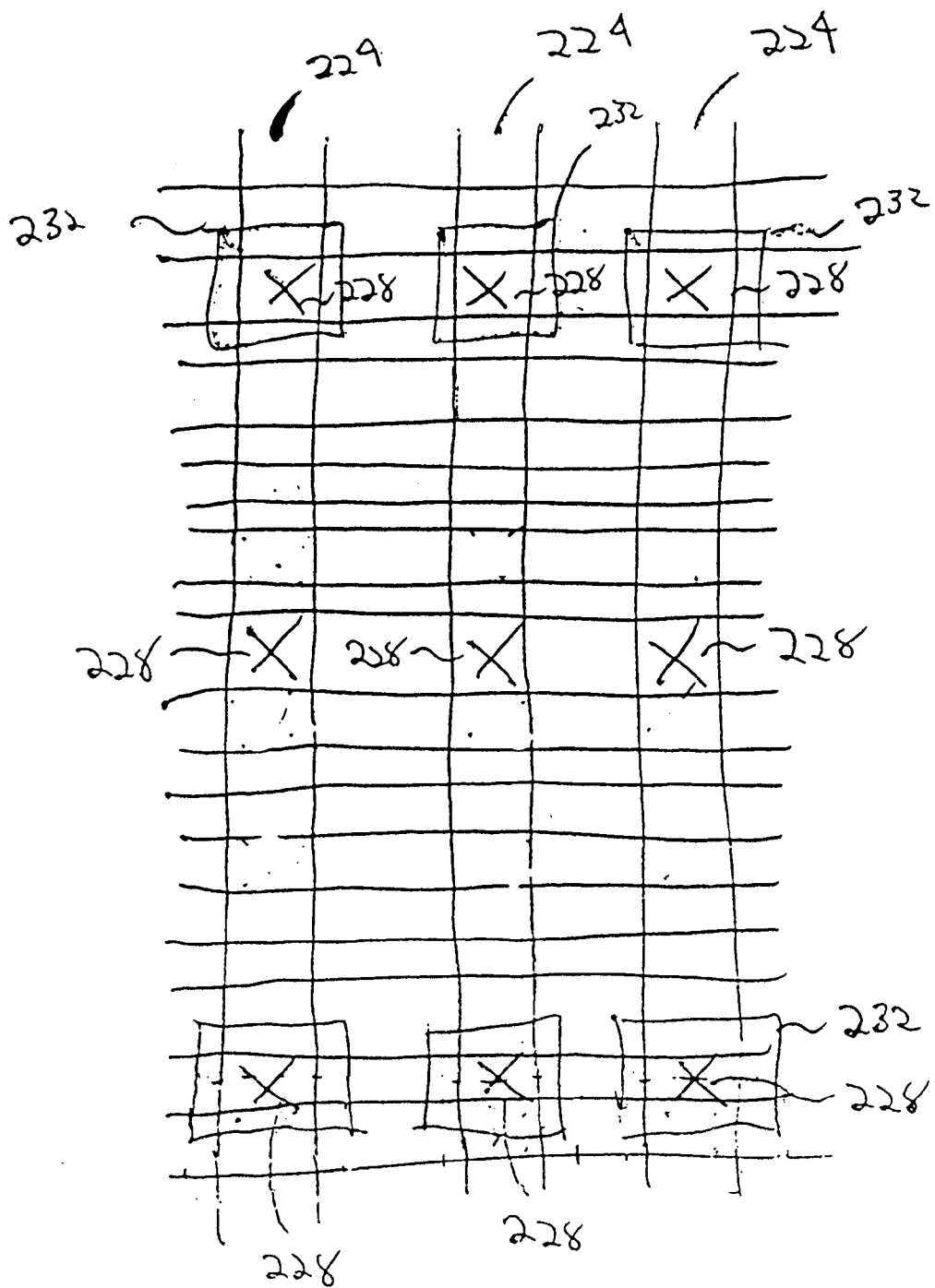
FIG. 8 illustrates a top cross-sectional view of the two-bit flash EEPROM cell of FIG. 7.

As shown in the enlarged cross-sectional schematic view of FIG. 7, polysilicon straps 231 can be made concurrently with without bitlines 226 and are used to connect each buried bitline 224 to the overlying gate electrode 229. As shown in FIG. 7 and in the array of memory cells of FIG. 8, the straps 231 connect the buried bitlines 224 to the gate/contacts 228. As shown in FIG. 8, the bitlines 224 are continuous, uniform and unbroken. The contacts 228 are aligned with each other along rows and columns where each contact overlies a buried bitline 224. The rows of contacts 228 are aligned along wordlines associated with polygates 229. Strapping the buried bitlines 224 to the gates 228 every 16 cells or wordlines reduces the resistance of a total memory array and so the number of cells between select transistors 232 is increased to a number greater than the contact spacing. This increased spacing results in reducing the total size of the memory array when compared with the array of FIG. 1 since the density of select transistors 232 has been reduced. This reduction in density is schematically shown in FIG. 8 where the select transistors 232 are placed so that their spacing is twice the spacing between consecutive contacts 228. Please note that while FIG. 8 shows a portion of an M×M memory array where M=10. The above principles can also be applied for when M=2, 3, . . . , etc.

It is important to note that when a semiconductor device is scaled, the channel lengths become shorter and short channel effects take hold. Thus, in the two bit memory cell, because each bit is stored in different areas of the transistor, short channel effects may become prevalent sooner than in the case of the single bit transistor. In order to retain the usable range of drain voltage, the two-bit transistor may need to be scaled by a smaller factor.

The foregoing description is provided to illustrate the invention, and is not to be construed as a limitation. Numerous additions, substitutions and other changes can be made to the invention without departing from its scope as set forth in the appended claims.

We claim:

1. An array of memory cells comprising:
   a plurality of memory cells interconnected via a grid of M wordlines and M bitlines, wherein M=2, 3, 4, 5, . . . , wherein each of said M bitlines is buried;
   a plurality of contacts, wherein each of said plurality of contacts is formed every N wordlines, N=1, 2, 3, . . . , wherein each of said plurality of contacts overlies a gate of a different one of said plurality of memory cells;
   a strap connecting one of said buried bitlines to a gate that underlies one of said plurality of contacts; and
   a select transistor formed every P wordlines, wherein P is greater than N.

2. The array of memory cells of claim 1, wherein N=16.

3. The array of memory cells of claim 1, wherein the bitlines are continuous, uniform and unbroken.

4. The array of memory cells of claim 1, wherein said plurality of contacts are aligned with each other along rows and columns.

5. The array of memory cells of claim 1, wherein each of said plurality of contacts overlies a buried bitline.

6. The array of memory cells of claim 4, wherein each of said plurality of contacts overlies a buried bitline.

7. The array of memory cells of claim 4, wherein said rows of contacts are aligned along said wordlines.

8. The array of memory cells of claim 1, wherein each of said plurality of memory cells comprises:
   a substrate that comprises a first region and a second region with a channel therebetween and a gate above said channel,
   a charge trapping region that contains a first amount of charge, and
   a layer positioned between said channel and said charge trapping region, wherein said layer has a thickness such that said first amount of charge is prevented from directly tunneling into said layer.

9. The array of memory cells of claim 8, wherein said charge trapping region comprises silicon nitride.

10. The array of memory cells of claim 8, wherein said gate comprises an N-type material.

11. The array of memory cells of claim 10, wherein said gate comprises a polycrystalline silicon.

12. The array of memory cells of claim 8, further comprising an insulating layer formed on and overlaying said charge trapping region.

13. The array of memory cells of claim 12, wherein said insulating layer comprises silicon dioxide.

14. The array of memory cells of claim 13, wherein said charge trapping region comprises silicon nitride.

15. The array of memory cells of claim 8, wherein each of said plurality of memory cells comprises an EEPROM memory cell.

16. The array of memory cells of claim 8, wherein each of said plurality of memory cells comprises a two-bit memory cell.

17. The array of memory cells of claim 8, wherein said substrate comprises a P-type substrate.

* * * * *